United States Patent
Wright et al.

(10) Patent No.: US 8,232,857 B1
(45) Date of Patent: Jul. 31, 2012

(54) FLUX-COUPLED TRANSFORMER FOR POWER AMPLIFIER OUTPUT MATCHING

(75) Inventors: Peter V. Wright, Portland, OR (US); Kenneth W. Mays, Tigard, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 450 days.

(21) Appl. No.: 12/478,664

(22) Filed: Jun. 4, 2009

Related U.S. Application Data

(60) Provisional application No. 61/169,643, filed on Apr. 15, 2009.

(51) Int. Cl.
*H01F 27/28* (2006.01)
(52) U.S. Cl. ........ 336/183; 336/182; 336/200; 445/107; 445/292
(58) Field of Classification Search .................... 455/83, 455/107; 336/223, 200, 183, 182, 207; 343/850; 327/574; 330/276
See application file for complete search history.

(56) References Cited

U.S. PATENT DOCUMENTS

| | | | |
|---|---|---|---|
| 4,156,173 A * | 5/1979 | Taralp | 327/574 |
| 7,365,602 B2 | 4/2008 | Bhatti et al. | |
| 2004/0017278 A1 * | 1/2004 | Castaneda et al. | 336/200 |
| 2006/0284718 A1 * | 12/2006 | Baumgartner et al. | 336/223 |
| 2007/0232241 A1 * | 10/2007 | Carley et al. | 455/83 |
| 2007/0296537 A1 * | 12/2007 | Yoon et al. | 336/223 |
| 2008/0012502 A1 * | 1/2008 | Lys | 315/247 |
| 2008/0204139 A1 * | 8/2008 | Komijani et al. | 330/276 |
| 2009/0289870 A1 * | 11/2009 | Rofougaran et al. | 343/850 |

* cited by examiner

*Primary Examiner* — Lana N Le
*Assistant Examiner* — Golam Sorowar
(74) *Attorney, Agent, or Firm* — Schwabe Williamson & Wyatt

(57) ABSTRACT

Embodiments of apparatuses, systems and methods relating to a flux-coupled transformer for power amplifier output matching are disclosed. Other embodiments may be described and claimed.

31 Claims, 7 Drawing Sheets

(a) FET (b) Bipolar

FLUX-COUPLED TRANSFORMER FOR POWER AMPLIFIER OUTPUT MATCHING

RELATED APPLICATIONS

The present application is a non-provisional application of provisional application No. 61/169,643, filed on 15 Apr. 2009, entitled "FLUX-COUPLED TRANSFORMER FOR POWER AMPLIFIER OUTPUT MATCHING," and claims priority to said provisional application. The specification of said provisional application is also hereby fully incorporated by reference in its entirety, except for those sections, if any, that are inconsistent with this specification.

TECHNICAL FIELD

Embodiments of the present invention relate generally to the field of circuits, and more particularly, to a flux-coupled transformer for power amplifier output matching.

BACKGROUND

Currently, the output impedance, which is generally a few Ohms, of power amplifiers in cellular phones is adapted to the impedance of the phone's antenna, which is typically 50 Ohms, with a lumped-element inductor-capacitor (LC) matching network. Increasingly, cellular phones must operate in multiple modes and across a wider range of frequencies. Also, improved efficiency and decreased size are increasingly desired for the phone's radio frequency (RF) functions, including the matching networks, so that additional services desired by customers can be added to the phone without compromising usability. LC power amplifier matching networks have three principal disadvantages that affect their ability to meet these needs: they are generally lossy, generally large, and generally operate effectively only over a limited bandwidth (approximately 10%).

At low frequencies, transformers are widely employed to implement high impedance ratio matching with low insertion loss. Typically, transformers employ some type of ferrite material, with high electrical permeability, to enhance the magnetic coupling between two electrical coils or inductors. However, at cellular frequencies of generally approximately 1 GigaHertz (GHz) and above, high permeability materials typically are associated with high RF losses, and thus are generally unsuitable. A type of non-isolating transformer, generally referred to as transmission-line (TL) transformers, is generally well known and employs both electrical and magnetic coupling, rather than magnetic coupling only. These devices may achieve low insertion loss at cellular frequencies, but in comparison to traditional magnetic or flux coupled transformers, they have two general disadvantages: they are physically very large, and they are not electrically isolated.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION OF EMBODIMENTS OF THE INVENTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

Figure 1:
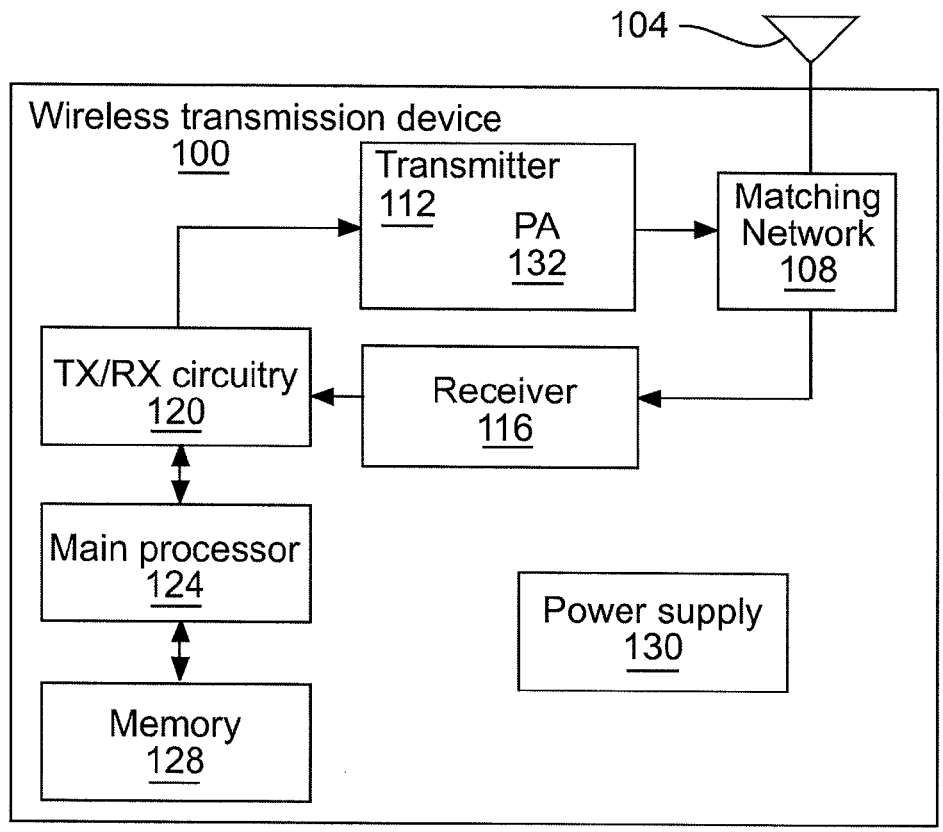
FIG. 1 schematically illustrates a wireless device in accordance with some embodiments.

FIG. 1 illustrates a wireless transmission device 100 in accordance with various embodiments. The wireless transmission device 100 may have an antenna structure 104, an impedance matching network 108, a transmitter 112, a receiver 116, transmit/receive (TX/RX) circuitry 120, a main processor 124, and a memory 128 coupled with each other at least as shown. The wireless transmission device 100 may also include a power supply 130, e.g., a battery, coupled with the various components to provide DC power.

In various embodiments, the wireless transmission device 100 may be, but is not limited to, a mobile telephone, a paging device, a personal digital assistant, a text-messaging device, a portable computer, a base station, a radar, a satellite communication device, or any other device capable of wirelessly transmitting RF signals.

The main processor 124 may execute a basic operating system program, stored in the memory 128, in order to control the overall operation of the wireless transmission device 100. For example, the main processor 124 may control the reception of signals and the transmission of signals by TX/RX circuitry 120, receiver 116, and transmitter 112. The main processor 124 may be capable of executing other processes and programs resident in the memory 128 and may move data into or out of memory 128, as desired by an executing process.

The TX/RX circuitry 120 may receive outgoing data (e.g., voice data, web data, e-mail, signaling data, etc.) from the main processor 124. The TX/RX circuitry 120 may transmit an RF signal that represents the outgoing data to the transmitter 112. The transmitter 112 may include a power amplifier (PA) 132 to amplify the RF signal for transmission. The amplified RF signal may be forwarded to the impedance matching network 108 and then to the antenna structure 104 for an over-the-air (OTA) transmission.

The PA 132 may operate at various output power levels depending on the mode of the wireless transmission device 100. For example, if the wireless transmission device 100 is a Global System for Mobile communications (GSM) device, the PA 132 may operate at a full power level of approximately 35 dBm [power ratio in decibels (dB) referenced to one milliwatt (mW)]. However, when the wireless transmission device 100 is operating in an enhanced data rate for GSM evolution (EDGE) mode, it may operate with a 6 dBm backoff, e.g., at 29 dBm. While GSM and EDGE standards may be discussed, teachings of this disclosure may apply equally well to other standards, e.g., CDMA, W-CDMA, etc.

In a manner complementary to the transmission operation, the TX/RX circuitry 120 may receive an incoming OTA signal from the antenna structure 104 through the impedance matching network 108 and receiver 116. The TX/RX circuitry 120 may process and send the incoming signal to the main processor 124 for further processing. While the wireless transmission device 100 is shown with transmitting and receiving capabilities, other embodiments may include wireless transmission devices without receiving capabilities. Additionally, the transmitter 112 and receiver 116 may be a single component in the form of a transceiver.

In various embodiments, the antenna structure 104 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Generally, the transmitter 112 and/or receiver 116 have different output impedances relative to an input impedance of the antenna 104. Thus, in accordance with various embodiments, impedance matching network 108 is provided. Note that for clarity and simplicity only the transmitter 112 will be referenced in describing embodiments of the present disclosure herein, although those skilled in the art will understand that the teachings are equally applicable to a receiver and/or a transceiver.

Figure 2:
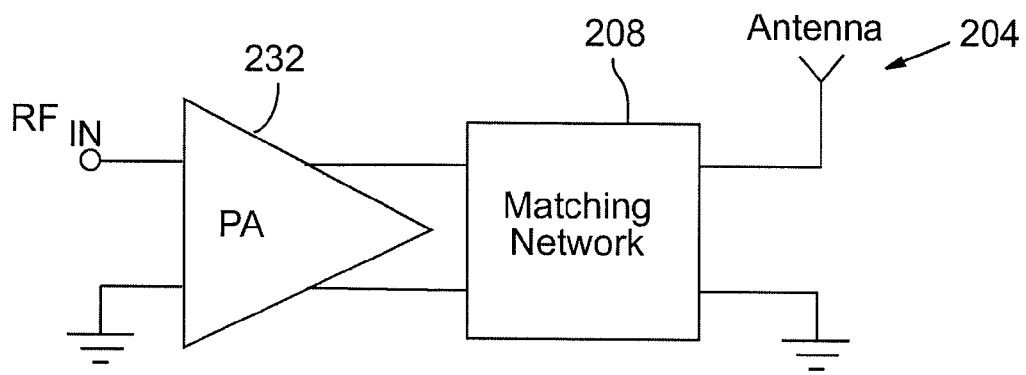
FIG. 2 schematically illustrates a simplified transmission arrangement of a wireless device in accordance with some embodiments.

FIG. 2 illustrates a simplified transmission arrangement of the wireless device 100. An RF signal is fed to a power amplifier 232, which may correspond to power amplifier 132. Power amplifier 232 amplifies the RF signal and then feeds the amplified signal to an impedance matching network 208, which may correspond to impedance matching network 108, which then feeds the amplified RF signal to the antenna 204, which may correspond to antenna 104. In accordance with various embodiments, the power amplifier 232 may be part of the impedance matching network 208. Additionally, the power supply 130 and/or one or more power amplifiers 232 may be considered a power arrangement for purposes of various embodiments disclosed herein.

In general and as an example for describing various embodiments of the present disclosure, the power supply 130 for the wireless device 100 may consist of, for example, an Li-ion battery, which in general has a voltage of approximately 3.5 volts. For GSM standards, maximum output power $P_{out}$ desired from the power amplifier 232 is approximately 35 dBm (3.16 Watts). Accordingly, denoting the power amplifier output impedance as $Z_{out}$, then $Z_{out}$ is approximately equal to 1.94 Ohms, given the relationship of $V^2/2Z_{out}=P_{out}$. In general, as an example, the antenna 204 may have an impedance of approximately 50 Ohms. Accordingly, for this example, the impedance transformation desired from the impedance matching network 208 is approximately 25 to 1 (25:1). Those skilled in the art will understand that other characteristics and values may be desired depending upon the application and that this simply represents one example. In various embodiments, the impedance transformation provided by the impedance matching network 208 may be, for example, in a range of 20:1 to 30:1 or in a range of 23:1 to 27:1.

Figure 3:
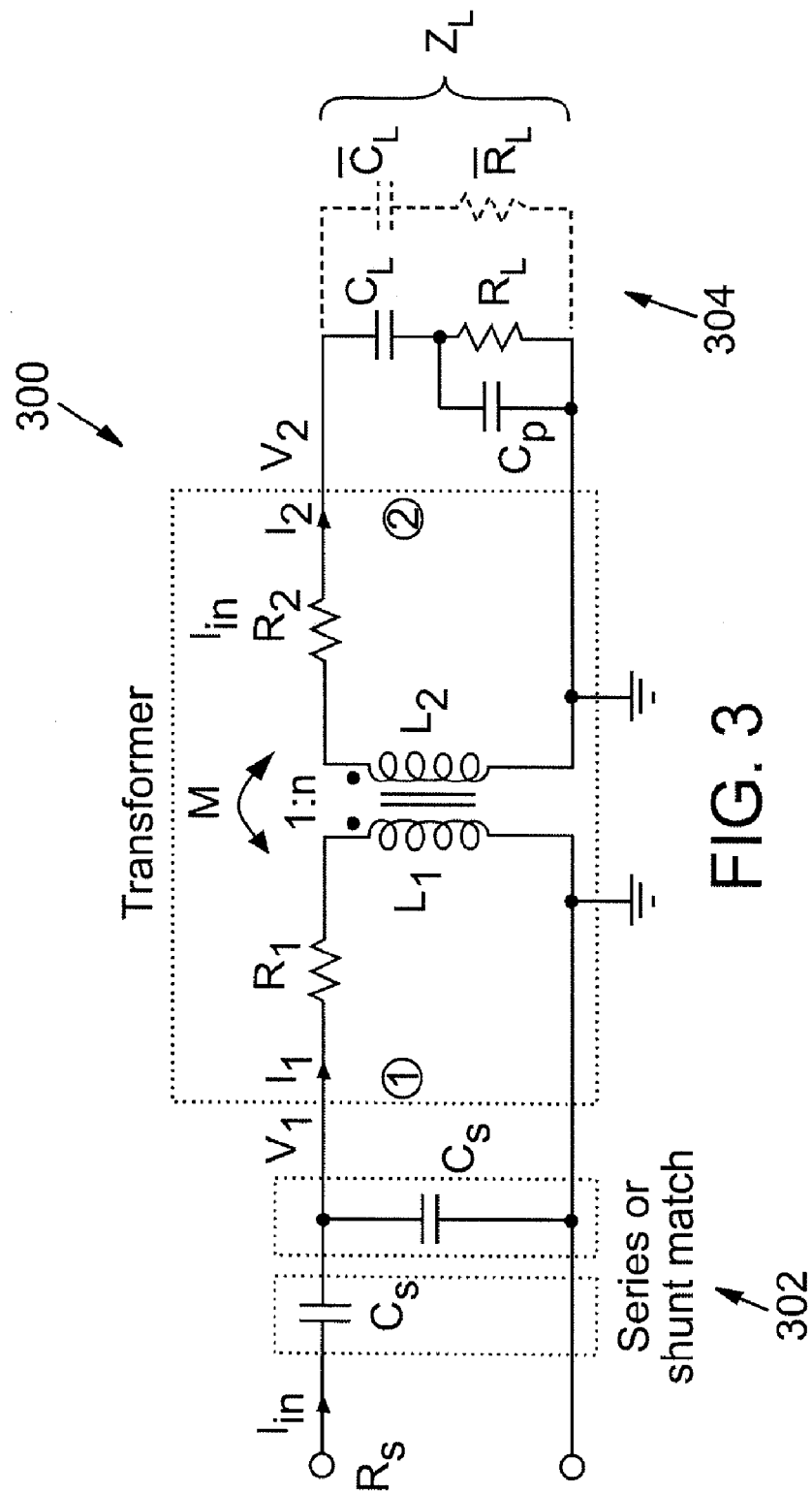
FIG. 3 schematically illustrates a simplified lumped-element model for a flux-coupled transformer in accordance with some embodiments.

With reference to FIG. 3, a flux-coupled, magnetic, transformer simplified lump-element model 300, generally known in the art, is illustrated. In general, the model includes two inductors $L_1$ and $L_2$ that transfer energy predominately through their magnetic field coupling. However, electric field coupling is often considered undesirable and results in mostly deleterious parasitic capacitances. Also, the dimensions of a flux-coupled transformer are generally much smaller than a wavelength at the frequency of the device's operation. The model also includes an input series or shunt match 302 and an output series or shunt match 304.

Generally, for the present example, the inductance ratio of $L_1$ to $L_2$ should be in the order of 25:1, which is typically needed for the GSM output match with series input and output tuning. In addition, a series resistance $R_1$ of much less than $Z_{out}$ (which, as stated above, is approximately 2 Ohms), and typically less than 100 milliOhms, is desirable. Also, the primary inductance $L_1$ is given by approximately $Z_{out}$ divided by $(\omega_0 \cdot k)$, where $\omega_0=2\pi f_0$, $0<k<1$ represents the coupling factor, $f_o$ represents the frequency, and $\omega_0$ represents the angular frequency. A small value for $Z_{out}$ generally results in a small optimum value for $L_1$, which is generally less than 1 nanoHenry. For broadband applications, low-loss impedance transformation and a high coupling factor k should be realized, e.g., with k greater than approximately 0.8. Finally, the primary inductor $L_1$ should be capable of carrying high current, which may typically be 5 times greater than the secondary inductor $L_2$.

Figure 4A:
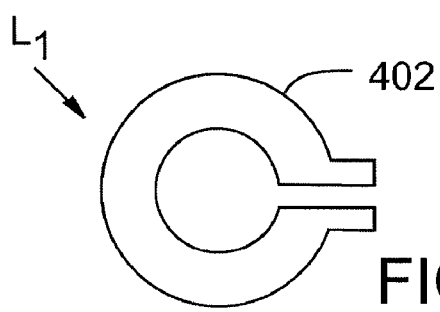
FIG. 4A schematically illustrates a primary inductor in accordance with some embodiments.
Figure 4B:
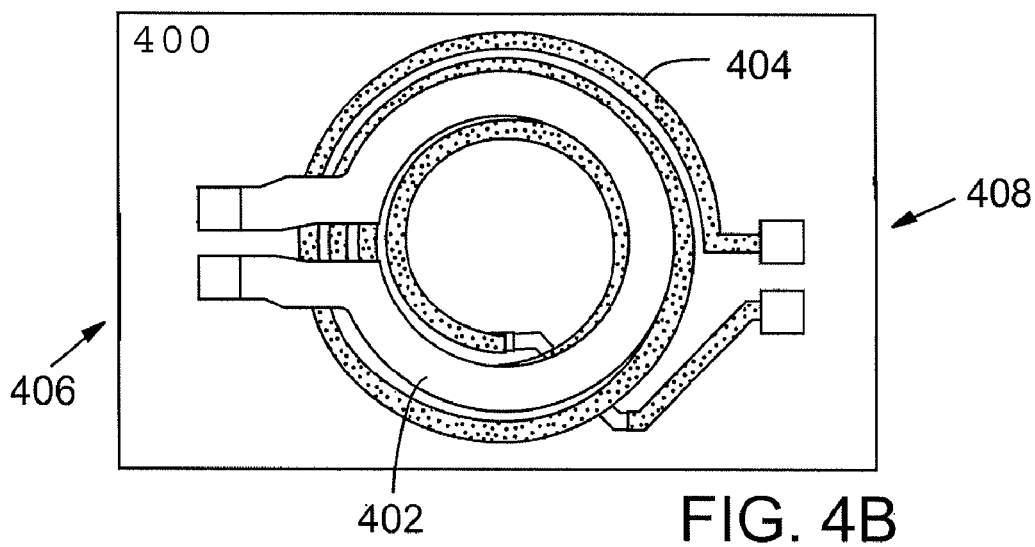
FIG. 4B schematically illustrates a parallel inductor transformer arrangement in accordance with some embodiments.

With reference to FIGS. 4A and 4B, in accordance with various embodiments of the present disclosure, in order to simultaneously meet the previously discussed desirable characteristics of very low inductance and very low resistance, with respect to the described example, and have a large surface area available to couple the primary (input) inductor $L_1$ to the secondary (output) inductor $L_2$, the primary inductor $L_1$ is implemented as a wide circular annulus 402. Wide circular annulus 402 is generally planar and realized within a layer of the apparatus 400 implementing the impedance matching network 108, e.g., a chip, a semiconductor device, etc., as is known in the art. The secondary inductor $L_2$ is implemented as a planar multi-turn spiral 404 in another layer separate from the layer in which the primary inductor $L_1$ is implemented. As known to those skilled in the art, the inductance of a multi-turn spiral is approximately proportional to $n^2$, where n=number of turns. Thus, for the previously discussed example where $L_2/L_1 \approx 25$, then $n \approx 5$. Accordingly, for the previously discussed example, the windings within secondary inductor $L_2$ should be equal to approximately 5 in order to achieve the desired ratio of 25:1.

In accordance with various embodiments, the inductors $L_1$ and $L_2$ are implemented in planar layers separated vertically by low-loss dielectric layers having a thickness and a range of approximately 5000 Angstroms to 2 micrometers. In order to achieve a magnetic coupling factor k greater than approximately 0.8, as desired for the previously described example, the secondary inductor $L_2$ is implemented as a planar multi-turn spiral 404 that is aligned with primary inductor $L_1$ such that secondary inductor $L_2$ has approximately 80 percent or more area overlap with primary inductor $L_1$. The overlap is generally with respect to the curves or windings. For many applications, the overlap may be approximately 70 percent to 80 percent, i.e., to achieve a magnetic coupling factor k of approximately 0.7 to 0.8, and for some applications, the overlap may be greater than 80 percent up to substantially 100 percent, i.e., to achieve a magnetic coupling factor k of approximately 0.8 to approximately 1.0. Additionally, depending upon the application, the overlap may be less than 70 percent.

As may be seen in FIG. 4B, the primary inductor $L_1$ includes a node 406, the low impedance node, to which the transmitter 112, or a power arrangement, may be operatively coupled. The secondary inductor $L_2$ includes a node 408, the high impedance node, to which the antenna 104, or another load, may be operatively coupled.

Thus, since the overlap only needs to be in a range of approximately 80 percent for the previously described example, embodiments of the present disclosure, depending upon the application, do not require critical layer-to-layer alignment. They only need to achieve approximately 80 percent or greater overlap. In accordance with the various embodiments of the present disclosure, preferred metals for implementation of the inductors $L_1$ and $L_2$ include low loss metals such as, for example, Cu, Au, Ag, and Al.

Figure 5:
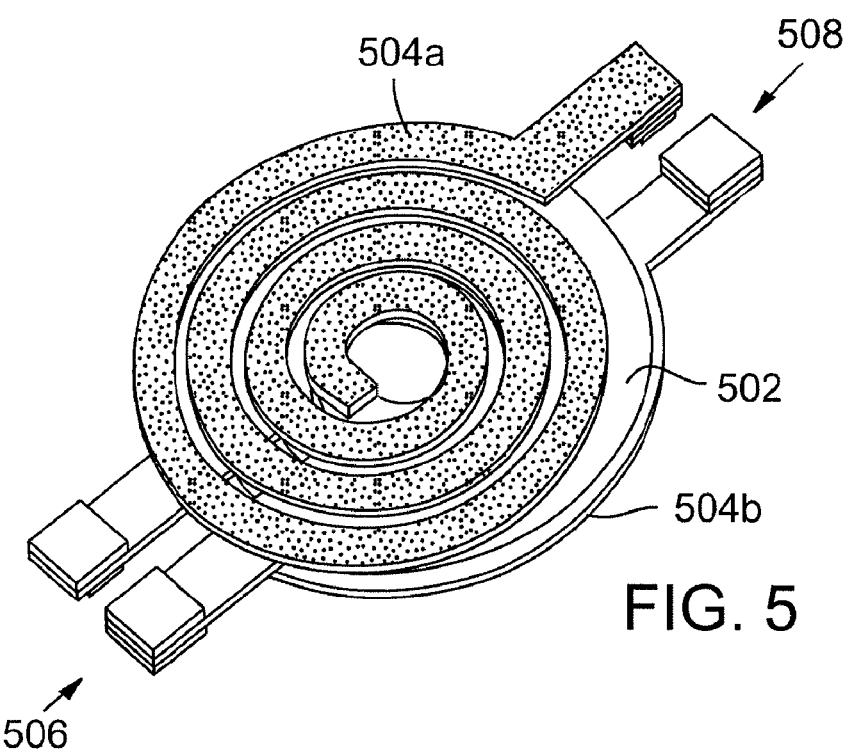
FIG. 5 schematically illustrates another parallel inductor transformer arrangement in accordance with some embodiments.
Figure 6A:
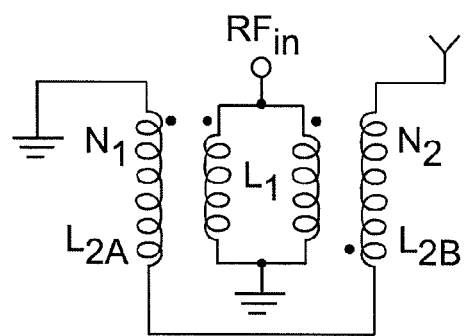
FIGS. 6A-6D schematically illustrate circuits representing examples of parallel inductor transformer arrangements in accordance with some embodiments.
Figure 6B:
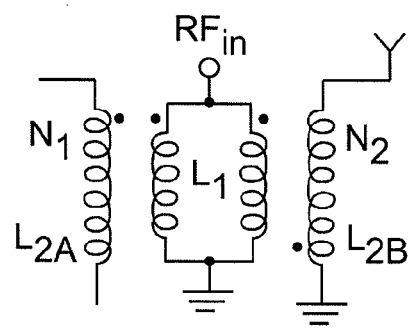
Figure 6C:
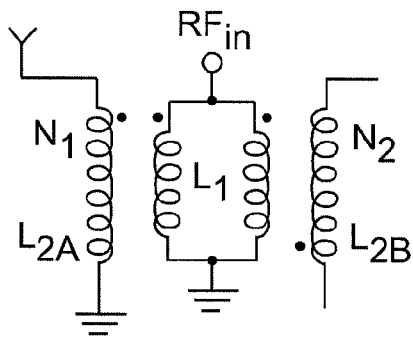
Figure 6D:
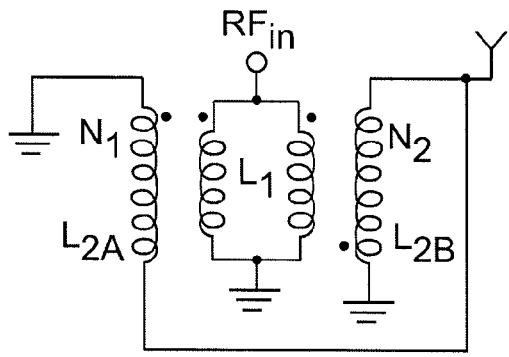

With reference to FIG. 5, in accordance with various embodiments of the present disclosure, the secondary inductor $L_2$ may be split between layers, with the primary inductor $L_1$ 502 implemented on an intermediate layer. The dual elements 504a, 504b of $L_2$ may be series connected between the layers in the middle of the apparatus, e.g., apparatus 400, by a through via. Such an embodiment may permit inductor $L_1$ 502 to be physically small enough to realize a low value of inductance as desired, while maintaining the large overlap area with secondary inductor $L_2$ to facilitate a high magnetic coupling coefficient. The embodiment once again includes a low impedance node 506 for coupling to the transmitter 112, or a power arrangement, and a high impedance node 508 for operatively coupling to the antenna 104, or other load.

In accordance with various embodiments of the present disclosure, the primary inductor $L_1$ may be realized on multiple layers, with the portions on the respective layers being connected in parallel to realize the primary inductor $L_1$. The secondary inductor $L_2$ may then be realized in an intermediate layer. This may allow for small values of the primary inductor $L_1$ to be realized while helping ensure sufficient area overlap with the secondary inductor $L_2$ to help ensure a high magnetic coupling coefficient.

In accordance with various embodiments of the present disclosure, in an embodiment in which the secondary inductor $L_2$ is realized in two different layers, the upper and lower coils 504a, 504b of the secondary conductor $L_2$ may have a different number of windings with respect to each other. These two sections 504a, 504b of the secondary inductor $L_2$ may then be connected via at least one RF switch, such as, for example, a pHEMT technology switch, or a Micro-Electro-Mechanical Systems (MEMS) technology switch, in order to facilitate realization of varying impedance transformation ratios. FIGS. 6A, 6B, 6C and 6D illustrate examples of circuits wherein multiple impedance ratios may be achieved with a split-layer secondary inductor $L_2A$, $L_2B$. Multiple impedance ratios with a split-layer secondary inductor $L_2$ may be used to maintain efficiency for different loading and output power conditions.

Figure 7:
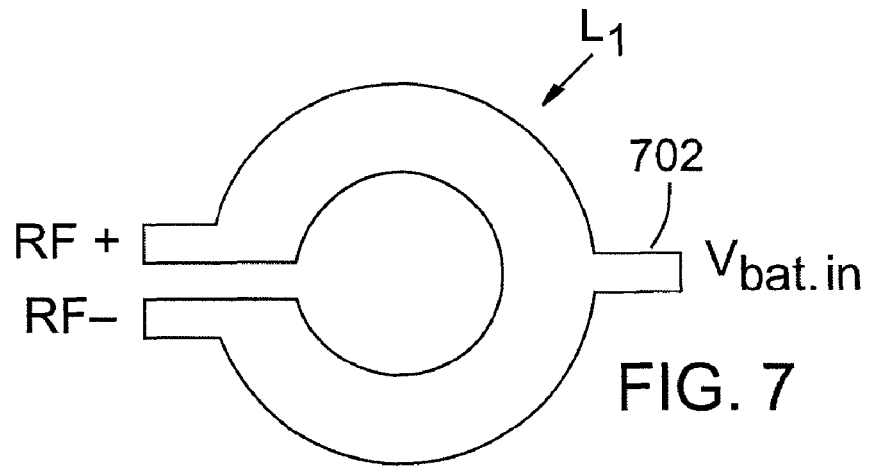
FIG. 7 schematically illustrates a circuit representing an example of a portion of a parallel inductor transformer arrangement that includes differential power amplifier architecture in accordance with some embodiments.
Figure 8A:
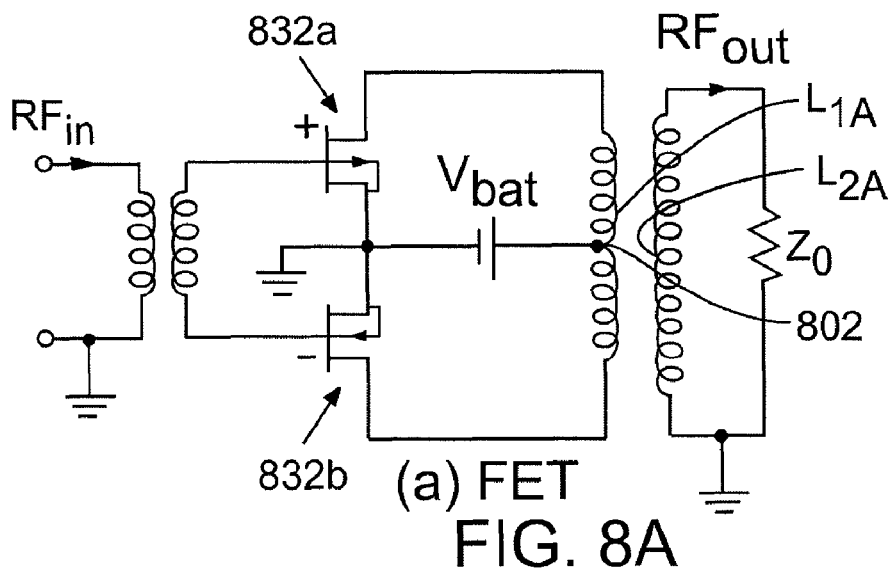
FIGS. 8A and 8B schematically illustrate circuits representing examples of parallel inductor transformer arrangements that include differential power amplifier architecture in accordance with some embodiments.
Figure 8B:
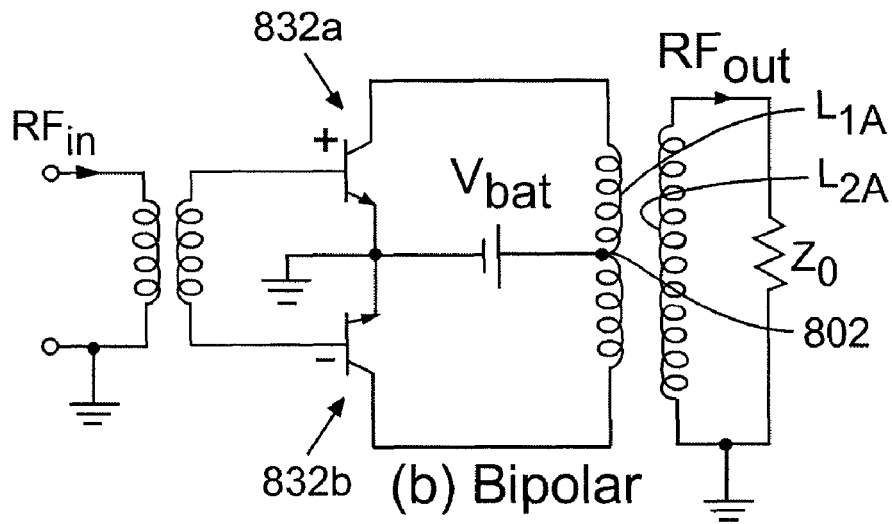

With reference to FIG. 7, in accordance with various embodiments of the present disclosure, a differential power amplifier architecture may be used with embodiments of a parallel inductor transformer for use in a matching network 108, described herein. With such a differential power amplifier architecture, the center point 702 of the primary inductor is a virtual RF ground. FIG. 8A illustrates a circuit of a parallel inductor transformer for use in a matching network 108 with a differential power amplifier implemented with a field effect transistor (FET) arrangement. FIG. 8B illustrates a circuit of a parallel inductor transformer for use in a matching network 108 with a differential power amplifier implemented with a bipolar transistor arrangement. If a shunt tuning option is employed on an input side of the matching network 108 (as illustrated in FIG. 3), the battery input to supply energy to both power amplifiers 832a, 832b may be fed in at the center 802 of the primary inductor. Such an arrangement may eliminate a physically large bias inductor that may be generally required in conventional LC matches.

Figure 9A:
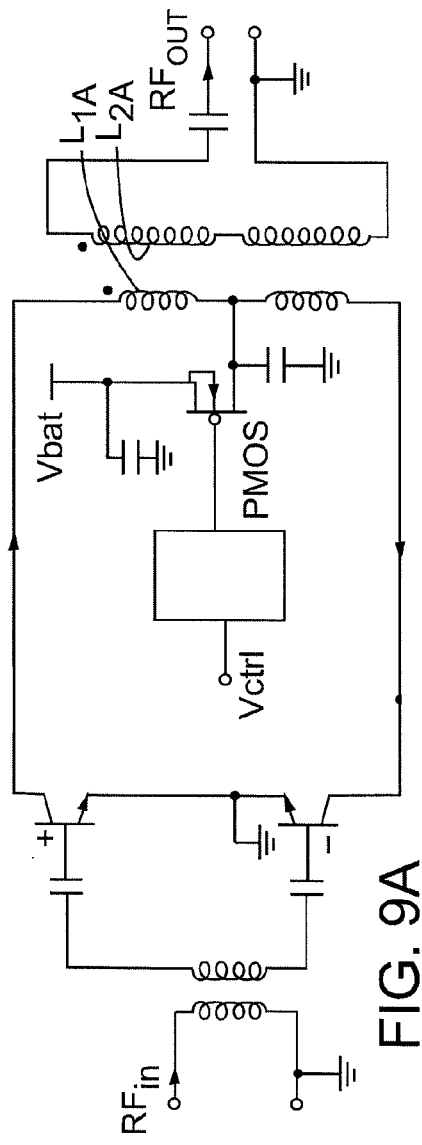
FIGS. 9A and 9B schematically illustrate exemplary circuits of parallel inductor transformer arrangements that include differential power amplifier architecture in accordance with some embodiments.
Figure 9B:
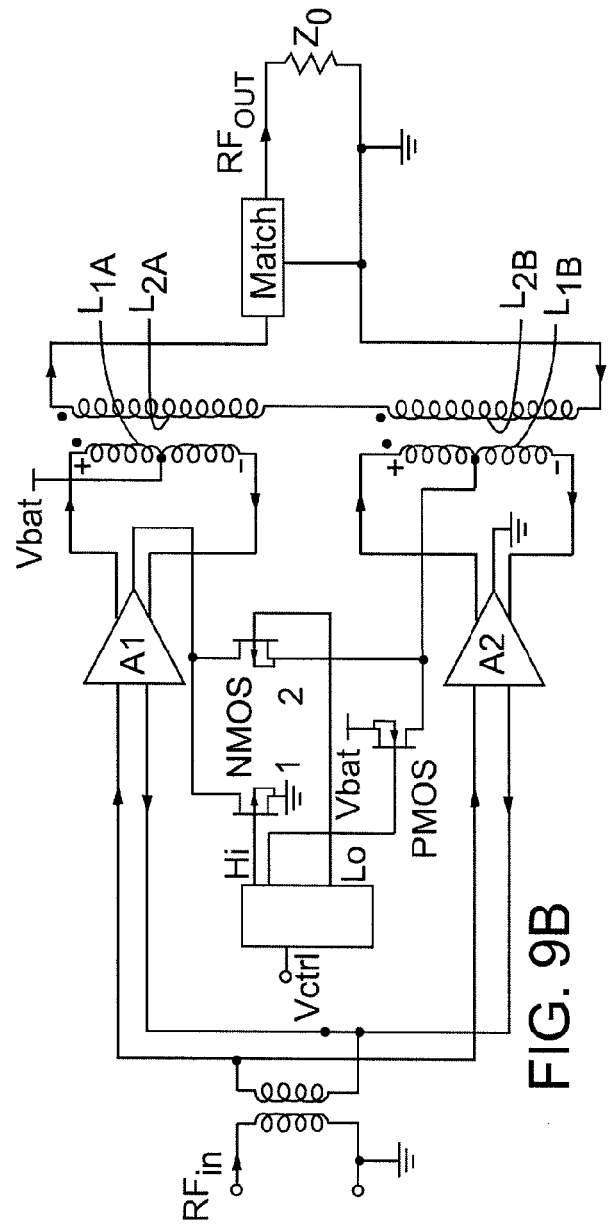

FIG. 9A illustrates an example of a differential PA architecture, with a parallel inductor transformer for use in a matching network 108 as disclosed in various embodiments herein, with transformer and $V_{CC}$ control. The DC supply may be connected to the center point of the primary inductor $L_1$, thereby eliminating the need for a conventional bias inductor. FIG. 9B illustrates an example of a dual-differential power amplifier architecture, with a parallel inductor transformer for use in a matching network 108 as disclosed in various embodiments herein, $V_{CC}$ control, and DC reconfiguration. The arrangement includes a split primary inductor $L_{1A}$, $L_{1B}$ and a split secondary inductor $L_{2A}$, $L_{2B}$.

Since the center of the primary inductor is virtual RF ground in a differential power amplifier architecture, this architecture, used with embodiments of the a parallel inductor transformer for use in a matching network 108 as disclosed herein, is suitable for DC reconfiguration for improved backed-off efficiency, as disclosed in co-pending patent application Ser. No. 12/364,759 filed on Feb. 3, 2009 titled "POWER AMPLIFIER WITH RECONFIGURABLE DIRECT CURRENT COUPLING."

Figure 10:
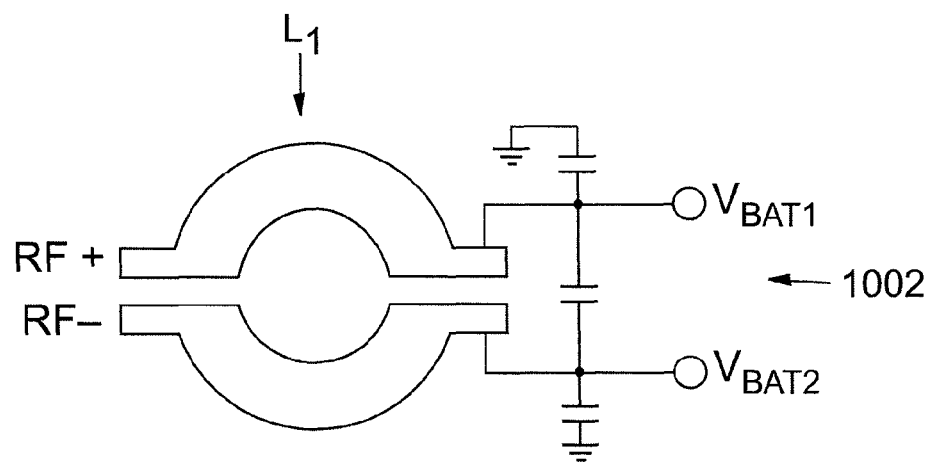
FIG. 10 schematically illustrates a circuit representing an example of a portion of a parallel inductor transformer arrangement that includes differential power amplifier architecture in accordance with some embodiments.
Figure 11:
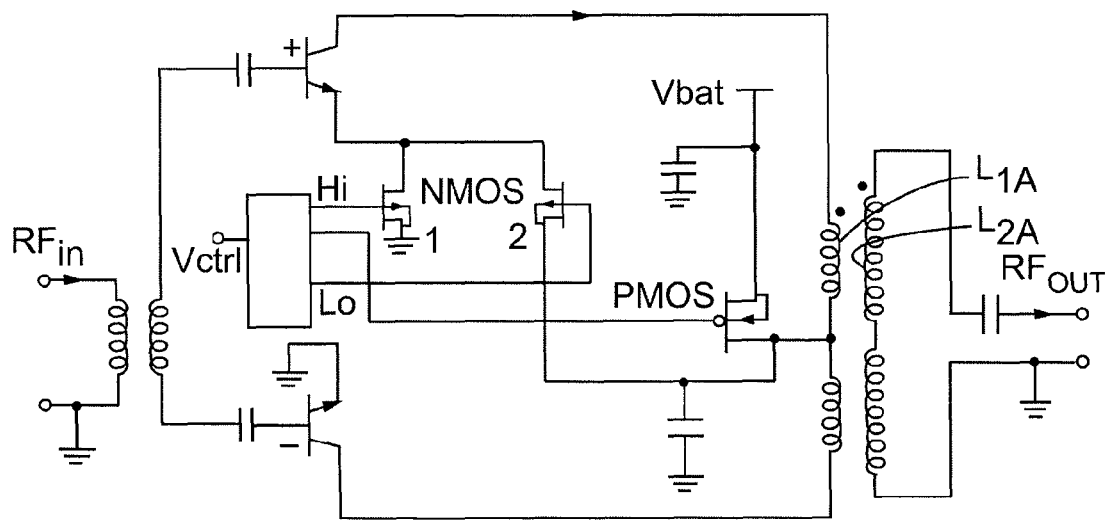
FIG. 11 schematically illustrates an exemplary circuit of another parallel inductor transformer arrangement that includes differential power amplifier architecture in accordance with some embodiments.

For a single differential power amplifier architecture with a parallel inductor transformer for use in a matching network 108 as described herein, a DC reconfiguration architecture (not utilizing a conventional bias inductor) may be achieved by introducing a DC break at the center 1002 of the primary inductor $L_1$, as illustrated in FIG. 10. A single differential power amplifier with a parallel inductor transformer for use in a matching network 108 as disclosed in various embodiments herein and a DC reconfiguration for improved backed-off efficiency, as disclosed in co-pending patent application Ser. No. 12/364,759, is illustrated in FIG. 11.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. An apparatus comprising:
   at least one power arrangement; and
   an impedance matching network, the impedance matching network comprising:
      a planar primary inductor having a single winding in a first layer of the apparatus; and
      a planar secondary inductor having multiple windings disposed solely in a second layer of the apparatus;
      wherein the planar secondary inductor and the planar primary inductor are aligned such that at least 70% of the multiple windings overlap with the single winding; and the at least one power arrangement is operatively coupled to a low impedance node of the impedance matching network and a high impedance node of the impedance matching network is configured to be operatively coupled to at least one load.

2. The apparatus of claim 1, wherein the planar secondary inductor and the planar primary inductor are aligned such that at least 80% of the multiple windings overlap with the single winding.

3. The apparatus of claim 2, wherein the planar secondary inductor and the planar primary inductor are aligned such that substantially all of the multiple windings overlap with the single winding.

4. The apparatus of claim 1, wherein the at least one power arrangement comprises a differential power amplifier arrangement.

5. The apparatus of claim 1, wherein the at least one load comprises an antenna.

6. The apparatus of claim 1, wherein the at least one power arrangement comprises a battery and at least one power amplifier.

7. The apparatus of claim 1, wherein the impedance matching network provides an impedance transformation in a range of 20:1 to 30:1.

8. The apparatus of claim 7, wherein the impedance matching network provides an impedance transformation in a range of 23:1 to 27:1.

9. The apparatus of claim 8, wherein the impedance matching network provides an impedance transformation of approximately 25:1.

10. The apparatus of claim 1, wherein the at least one planar primary inductor consists of the single winding in the first layer.

11. An apparatus comprising:
    at least one power arrangement; and
    an impedance matching network, the impedance matching network comprising:
       a planar primary inductor having a single winding in a first layer of the apparatus; and
       a first planar secondary inductor having multiple windings in a second layer of the apparatus; and
    wherein
       the first planar secondary inductor and the planar primary inductor are aligned such that at least 70% of the multiple windings overlap with the single winding;
       the at least one power arrangement is operatively coupled to a low impedance node of the impedance matching network and a high impedance node of the impedance matching network is configured to be operatively coupled to at least one load; and
       the planar primary inductor is located between the first and the second planar secondary inductors.

12. The apparatus of claim 11, wherein the second planar secondary inductor comprises multiple windings in a third layer.

13. The apparatus of claim 12, wherein the first and second planar secondary inductors each comprise a different number of windings.

14. An apparatus comprising:
    at least one power arrangement; and
    an impedance matching network, the impedance matching network comprising:
       a first planar primary inductor having a single winding in a first layer of the apparatus;
       a second planar primary inductor; and
       a planar secondary inductor having multiple windings in a second layer of the apparatus;
    wherein
       the planar secondary inductor and the first planar primary inductor are aligned such that at least 70% of the multiple windings overlap with the single winding;
       the at least one power arrangement is operatively coupled to a low impedance node of the impedance matching network and a high impedance node of the impedance matching network is configured to be operatively coupled to at least one load; and
       the planar secondary inductor is located between the first and second planar primary inductors.

15. A method comprising:
    providing a planar primary inductor having a single winding within a first layer of an apparatus;
    providing a planar secondary inductor having multiple windings disposed solely within a second layer of the apparatus;
    operatively coupling the planar primary inductor with the planar secondary inductor such that at least 70% of the multiple windings overlap with the single winding to provide an impedance matching network;
    operatively coupling at least one power arrangement to a low impedance node of the impedance matching network; and
    operatively coupling at least one load to a high impedance node of the impedance matching network.

16. The method of claim 15, wherein the planar primary inductor and the planar secondary inductor are operatively coupled such that at least 80% of the multiple windings overlap with the single winding.

17. The method of claim 16, wherein the planar primary inductor and the planar secondary inductor are operatively coupled such that substantially all of the multiple windings overlap with the single winding.

18. The method of claim 15, wherein the planar secondary inductor is a first planar secondary inductor and the method further comprises:
providing a second planar secondary inductor located within a third layer of the apparatus, wherein the first layer is located between the second and third layers.

19. The method of claim 15, wherein providing the planar primary inductor is a first planar primary inductor and the method further comprises:
providing a second planar primary inductor having a single winding, the second planar primary inductor located within a third layer of the apparatus, wherein the second layer is located between the first and third layers.

20. A system comprising:
a power supply;
a transmitter operatively coupled to the power supply and including at least one radio frequency (RF) power amplifier arrangement to amplify an input RF signal;
an antenna to transmit an output RF signal based upon the input RF signal; and
an impedance matching network operatively coupling the transmitter and the antenna, the impedance matching network comprising:
a planar primary inductor having a single winding in a first layer; and
a planar secondary inductor having multiple windings disposed solely in a second layer;
wherein the planar secondary inductor and the planar primary inductor are aligned such that at least 70% of the multiple windings overlap with the single winding; and
wherein the transmitter is operatively coupled to a low impedance node of the impedance matching network and the antenna is operatively coupled to a high impedance node of the impedance matching network.

21. The system of claim 20, wherein the planar secondary inductor and the planar primary inductor are aligned such that substantially all of the multiple windings overlap with the single winding.

22. The system of claim 20, wherein the planar secondary inductor is a first planar secondary inductor and the impedance matching network further comprises a second planar secondary inductor, wherein the planar primary inductor is located between the first and second planar secondary inductors.

23. The system of claim 22, wherein the second planar secondary inductor comprises multiple windings.

24. The system of claim 23, wherein the first and the second planar secondary inductors each comprise a different number of windings.

25. The system of claim 24, wherein the first and second planar secondary inductors are operatively coupled to one another via at least one RF switch to facilitate realization of varying impedance transformation ratios.

26. The system of claim 20, wherein the planar primary inductor is a first planar primary inductor and the impedance matching network further comprises a second planar primary inductor, wherein the planar secondary inductor is located between the first and second planar primary inductors.

27. The system of claim 20, wherein the at least one RF power amplifier arrangement comprises a differential power amplifier arrangement.

28. The system of claim 20, wherein the power supply comprises a battery and the planar secondary inductor and the planar primary inductor are aligned such that at least 80% of the multiple windings overlap with the single winding.

29. The system of claim 20, wherein the impedance matching network provides an impedance transformation in a range of 20:1 to 30:1.

30. The system of claim 29, wherein the impedance matching network provides an impedance transformation in a range of 23:1 to 27:1.

31. The system of claim 30, wherein the impedance matching network provides an impedance transformation of approximately 25:1.

* * * * *

UNITED STATES PATENT AND TRADEMARK OFFICE
CERTIFICATE OF CORRECTION

| | | |
|---|---|---|
| PATENT NO. | : 8,232,857 B1 | Page 1 of 1 |
| APPLICATION NO. | : 12/478664 | |
| DATED | : July 31, 2012 | |
| INVENTOR(S) | : Wright et al. | |

It is certified that error appears in the above-identified patent and that said Letters Patent is hereby corrected as shown below:

In the Claims

Col. 8, lines 12-16, Claim 11. —

…; and
  a first planar secondary inductor having
    multiple windings in a second layer of
    the apparatus; and
wherein
  the first planar secondary inductor … should read —

…; and
  a first planar secondary inductor having
    multiple windings in a second layer of
    the apparatus; and
  a second planar secondary inductor;
wherein
  the first planar secondary inductor …

Signed and Sealed this
Eleventh Day of February, 2014

Michelle K. Lee
*Deputy Director of the United States Patent and Trademark Office*